United States Patent [19]

Buurma

[11] 4,237,390
[45] Dec. 2, 1980

[54] SWITCHING COMPARATOR

[75] Inventor: Gerald B. Buurma, San Jose, Calif.

[73] Assignee: National Semiconductor Corporation, Santa Clara, Calif.

[21] Appl. No.: 946,477

[22] Filed: Sep. 28, 1978

[51] Int. Cl.³ ...................... H03K 5/24; H03K 17/296
[52] U.S. Cl. .................................... 307/362; 307/240
[58] Field of Search .............. 307/240, 251, 243, 355, 307/DIG. 1, DIG. 3, 362; 340/347 AD, 347 CC

[56] References Cited

U.S. PATENT DOCUMENTS

| | | | |
|---|---|---|---|
| 3,289,093 | 11/1966 | Wanlass | 307/304 X |
| 3,510,684 | 5/1970 | Martin | 307/240 |
| 3,676,702 | 7/1972 | McGrogan, Jr. | 307/251 X |
| 4,028,558 | 6/1977 | Heller et al. | 307/355 |
| 4,075,509 | 2/1978 | Redfern | 307/240 X |
| 4,097,753 | 6/1978 | Cook et al. | 307/DIG. 3 X |
| 4,139,787 | 2/1979 | Amelio | 307/243 X |

OTHER PUBLICATIONS

Craig, "Sensitive Single Input Voltage Detector", *IBM Tech. Discl. Bull.*, vol. 17, No. 8, pp. 2231-2232, Jan., 1975.
Hamadé et al., "Session XIII, Analog to Digital Conversion", *1976 IEEE Int'l Solid-State Circuits Conf.*, 2/19/76, pp. 154-155 Dig. of Technical Papers.

*Primary Examiner*—Larry N. Anagnos
*Attorney, Agent, or Firm*—Gail W. Woodward

[57] ABSTRACT

Buffer means are included in the input circuit in a switching comparator. The unavoidable shunt capacitance at the comparison node is thereby isolated from the input terminal. This substantially reduces the comparator d-c input loading to improve comparison accuracy particularly with sources having appreciable internal resistance.

8 Claims, 4 Drawing Figures

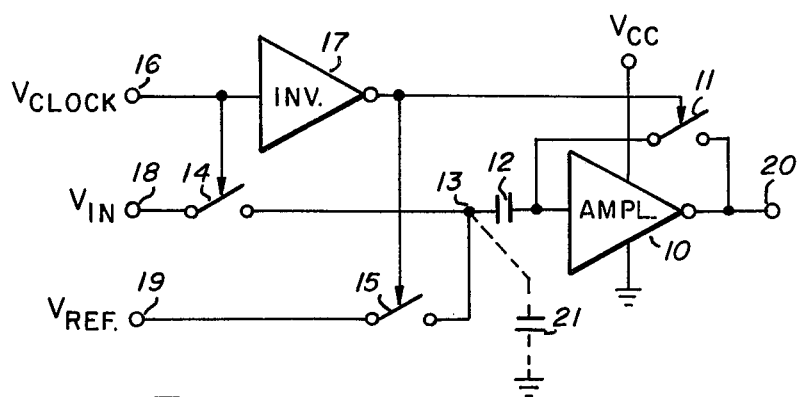
Fig_1 PRIOR ART
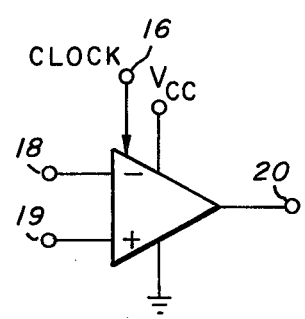
Fig_2 PRIOR ART
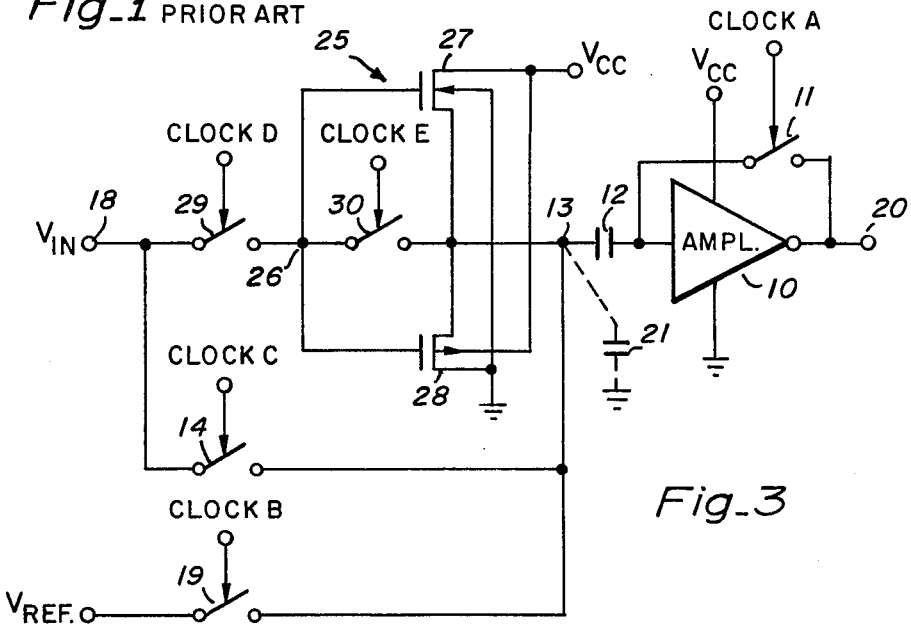
Fig_3
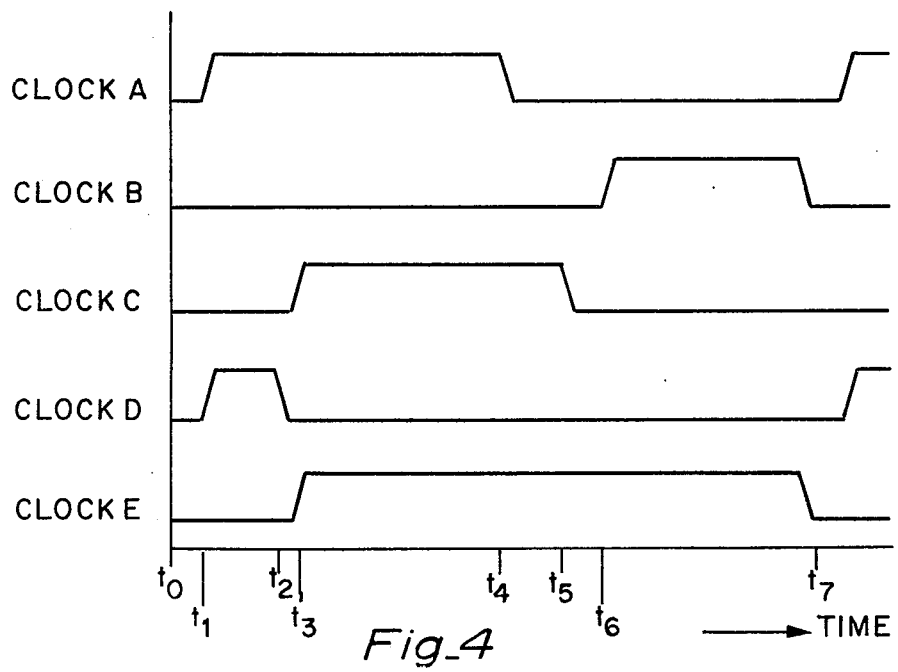
Fig_4

4,237,390

SWITCHING COMPARATOR

BACKGROUND OF THE INVENTION

The invention relates to comparators of the kind commonly used in analog to digital (A/D) converters. It particularly relates to the switching variety of comparator in which an a-c coupled amplifier is chopper stabilized and switched between the two comparator inputs so that the output is responsive to the potential difference between the two inputs. Since the switching is synchronous, the input can respond to d-c and the output is a d-c signal. Since the a-c amplifier can be readily made to have high stable gain, comparator sensitivity is high. Since chopper stabilization is employed, substantially zero offset is available without trimming and drift problems, both thermal and long term, are avoided.

In a copending application by Thomas P. Redfern, Joseph J. Connolly, and Thomas M. Frederiksen, Ser. No. 872,966 filed on Jan. 1, 1978, a PRECISION PLURAL INPUT VOLTAGE AMPLIFIER AND COMPARATOR is disclosed. The conventional switching comparator is discussed and a multiple input pair device disclosed along with means for sense polarity control.

Unfortunately all switching comparators have unavoidable stray or shunt capacitance, much of which is produced by the a-c amplifier coupling capacitor. For most applications, this capacitance can, by careful design, be reduced to very low and acceptable values. As a practical matter such shunt capacitance must be charged (or discharged) in the switching cycle. Thus, the switching cycle must be made long enough to provide adequate charging time. In terms of the comparator d-c input, an input loading current is present except for when the inputs are equal. Where the inputs are substantially different such input loading can present a problem in some circuit designs. In any event, it is desirable to reduce input loading and charging time to whatever extent is practical.

SUMMARY OF THE INVENTION

It is an object of the invention to reduce the input loading and capacitance charging time of a switching comparator.

It is a further object of the invention to improve the performance of a switching comparator by isolating the input capacitance from the comparator input terminal.

It is a still further object of the invention to provide buffer means between the input terminal of a switching comparator and the circuit input capacitance wherein the buffer acts to precharge the capacitance when the comparator input differential exceeds a predetermined minimum value.

These and other objects are achieved in the following manner. A buffer, typically in the form of a voltage follower, is coupled between the input terminal and the comparison node in a switching comparator. The buffer isolates the node capacitance from the input terminal and will act to rapidly precharge the node to close to the zero differential level without loading the input. Means for bypassing the buffer are provided during an actual comparison interval.

Typically only one of the comparator inputs is buffer isolated. However, if desired, both inputs can be treated in the same manner.

BRIEF DESCRIPTION OF THE DRAWING

FIG. 1 is a diagram of a simplified switching comparator;

FIG. 2 is the drawing symbol that portrays the circuit of FIG. 1;

FIG. 3 is a schematic diagram of a switching comparator employing the invention; and FIG. 4 is a timing diagram showing the relationships between the various clock signals to be used in FIG. 3.

DESCRIPTION OF THE PRIOR ART

FIG. 1 shows a simplified prior art comparator. The heart of the system is a high gain, inverting, a-c amplifier 10. Switch 11 is arranged to periodically connect the output to the input. For this condition the amplifier will be driven to its trip point which is defined as that level where the output equals the input and is typically close to $V_{CC}/2$. While a single amplifier is shown, a plurality of single inverter stages can be cascaded with each one being supplied with a switch beam input and output terminals and a coupling capacitor. The actual number of stages is selected to give the desired overall gain which establishes the comparator sensitivity.

A coupling capacitor 12 couples amplifier 10 to comparison node 13. A pair of switch devices 14 and 15 are operated in complementary fashion from a clock source at terminal 16 by virtue of inverter 17. It will be noted that switch 11 is operated in the same time sequence as switch 15.

For the purposes of the following discussion, it will be assumed that the switches are all turned on when the clock signal is high or at logic 1. When the clock signal is low or logic 0, the switches will be off.

Since switches 14 and 15 are clocked in complementary fashion, it can be seen that $V_{IN}$ at terminal 18 and $V_{REF}$ at terminal 19 will be alternately coupled to node 13. The timing is ordinarily made such that the switching rate is within the a-c bandpass of the amplifier capacitor 12 combination.

For the condition where the clock signal on terminal 16 is low, it can be seen that switch 14 will be open and switches 11 and 15 will be closed. For this condition, capacitor 12 will charge to $V_{REF} - V_{TRIP}$.

When the clock signal at terminal 16 goes high, switches 11 and 15 are off and switch 14 is on. If $V_{IN}$ is equal to $V_{REF}$ there will be no change in charge on capacitor 12 and output terminal 20 will remain at $V_{TRIP}$ or about $V_{CC}/2$. If $V_{IN}$ is positive with respect to $V_{REF}$, output terminal 20 will go low and if $V_{IN}$ is negative with respect to $V_{REF}$, output termnal 20 will go high. Thus $V_{IN}$ at terminal 18 could be regarded as the comparator inverting input (−) while terminal 19 is the noninverting input (+). FIG. 2 represents the circuit symbol for the system of FIG. 1. If desired, the clock phases to switches 14 and 15 can be reversed or toggled with respect to switch 11. In this case the sense of input terminals 18 and 19 will be reversed. Thus, any desired sense polarity can be selected.

The comparator sensitivity is a function of the amplifier gain. For example, with a $V_{CC}$ of 5 volts and a gain of $10^3$, an input differential of only 2.5 millivolts will drive the output terminal to either $V_{CC}$ or ground, depending upon the relative polarities of $V_{IN}$ and $V_{REF}$. It will be noted that the common mode input range is not related to the power supply. The inputs can exceed $V_{CC}$ and can be either negative or positive with respect to ground.

One of the limiting parameters in the circuit of FIG. 1 is the stray capacitance of node 13 which is shown as capacitor 21 connected with dashed lines to indicate that it is not an intended circuit component. This capacitance is made up of the input capacitance of amplifier 10 (as seen in series with capacitor 12); the capacitance of the terminals of switches 11, 14, and 15; the stray capacitance of capacitor 12 to ground; and the stray metallization capacitance to ground of the wiring. The total value of this capacitance can be substantial and capacitor 21 must be charged (or discharged) through switch 14 before the circuit can react to a differential voltage at terminal 18. Such charging or discharging constitutes an input current to the comparator which in the ideal case should be zero. Furthermore, such charging has an associated time constant which limits the circuit switching rate.

DESCRIPTION OF THE INVENTION

In FIG. 3, the preferred embodiment of the invention is shown. Where the circuit elements are a counterpart to those of FIG. 1, similar reference numbers are used. The various switches are operated in a sequence that is illustrated in the timing diagram of FIG. 4. These waveforms are developed in conventional state-of-the-art clock circuitry not shown.

One of the essential elements of FIG. 3 is a voltage follower 25 which is made up of a pair of complementary MOS transistors 27 and 28 connected as shown between $V_{CC}$ and ground. The output is at node 13 and the input is at node 26. When switch 30 is open, voltage follower 25 is active and isolates nodes 26 and 13. When switch 30 is closed, both transistors 27 and 28 are turned off, thereby disconnecting them from the circuit, and nodes 26 and 13 are coupled together. When voltage follower 25 is active, it will drive node 13 to within one transistor threshold of node 26 and any capacitance at node 13 will be isolated from node 26. Thus, the stray capacitance at node 26 is predominately the capacitance of the gate electrodes of transistors 27 and 28. This capacitance can be made much smaller than capacitance 21 which, as noted above, includes the stray capacitance of capacitor 12.

Using the timing diagram of FIG. 4, the sequence of operation is as follows. At time t0, all clock signals are low and all switches are open. This represents the condition just before the start of an operating cycle. At time t1, clock A closes switch 11 and clock D closes switch 29. For these conditions amplifier 10 is at its trip point and $V_{IN}$ is coupled to voltage follower 25. Thus, capacitor 12 will be charged to within one threshold of $V_{IN}-V_{TRIP}$. Capacitance 21 will be charged to within one threshold of $V_{IN}$ without loading the $V_{IN}$ terminal because of the isolation afforded by voltage follower 25. After a brief period of time, long enough for the circuit to stabilize, at t2 clock D opens switch 29 and a short time later at t3 clock E closes switch 30 which disables voltage follower 25. At the same time (t3) clock C closes switch 14 which couples $V_{IN}$ to node 13. Thus, capacitor 12 will become charged to exactly $V_{IN}-V_{TRIP}$ and capacitance 21 will charge to $V_{IN}$. Since these capacitors were precharged to within one threshold of their final value, very little charging current is involved and $V_{IN}$ is relatively unloaded. Also the time required to achieve the final charges is short.

The interval t3-t4 is selected to assure the complete charging of the capacitances and at t4 clock A opens switch 11 to make amplifier 10 active. Then at t5 clock C opens switch 14 and a short time later at t6 clock B closes switch 19, thus coupling $V_{REF}$ to node 13. The delays employed in the t4 to t6 interval are to avoid switching transients that might be troublesome if the switches were actuated simultaneously.

At time t6 the input to amplifier 10 is $V_{REF} - (V_{IN} - V_{TRIP})$ or $V_{REF} - V_{IN} + V_{TRIP}$. Since $V_{TRIP}$ represents the decision level of amplifier 10, if $V_{REF}$ is greater than $V_{IN}$, terminal 20 goes low. If $V_{IN}$ is greater than $V_{REF}$, terminal 20 will go high. The interval t6 to t7 is made long enough to read out the state of the output of amplifier 10 and includes the comparison interval. At t7 the switches revert to the t0 state, thus completing one cycle of operation.

While in terms of the circuit buffer, a CMOS voltage follower 25 is shown in FIG. 3. Other voltage followers with a low threshold could be used, provided means are included for bypassing and disconnect. Furthermore, only one such buffer is shown in FIG. 3 in the $V_{IN}$ or terminal 18 input. If desired, a second such buffer could be incorporated into the $V_{REF}$ or terminal 19 input. This would be useful where loading of the reference is to be reduced as well as $V_{IN}$ or where a symmetrical input comparator is desired. The second buffer would, of course, require additional appropriate clock signals and switches for its implementation.

The invention has been described and a preferred embodiment presented in detail. Clearly there are other alternatives and equivalents within the spirit and intent of the invention that will occur to a person skilled in the art upon reading the foregoing description. Accordingly, it is intended that the scope of the invention be limited only by the claims that follow.

I claim:

1. A switching comparator circuit having first and second inputs and an output responsive to the difference in input potentials, said circuit comprising:
    amplifier means having an output terminal constituting said comparator output, an input terminal, and a trip point;
    means for periodically forcing said amplifier means to said trip point;
    capacitor means coupled between said amplifier means input terminal and a circuit node, said circuit node having appreciable stray capacitance;
    means for alternately coupling said circuit node to said first and second inputs in synchronism with said means for periodically forcing said amplifier to said trip point whereby said output is a function of the difference in potential between said first and second inputs; and
    means for isolating said node from one of said first and second inputs whereby the loading produced by said stray capacitance is reduced.

2. The comparator circuit of claim 1 wherein said means for isolating comprise:
    a voltage follower having an input coupled to said one of said first and second inputs and an output coupled to said circuit node.

3. The comparator circuit of claim 2 further comprising means for periodically bypassing said voltage follower in synchronism with said means for periodically forcing said amplifier means to said trip point.

4. The comparator circuit of claim 3 wherein said voltage follower comprises a pair of complementary metal oxide semiconductor transistors coupled in series between a pair of terminals connectible to a power supply, each of said transistors being connected as a source follower.

5. The comparator circuit of claim 4 further including switching means coupled between said voltage follower and said one of said first and second input terminals, said switching means being operated in synchronism with said means for bypassing said voltage follower.

6. In a d-c comparator having an output responsive to the difference in potential between first and second input terminals, said comparator comprising a high gain a-c amplifier coupled between an input node and said comparator output, clocked switching means for stabilizing the operating point of said amplifier and switching said input node alternately between said first and second input terminals, the improvement comprising:

buffer means coupled between said first terminal and said input node; and means for periodically bypassing said buffer over a time interval during which said comparator output is a precise function of said difference in potential.

7. The improvement of claim 6 wherein said buffer means comprise:

a voltage follower circuit characterized as having an input capacitance substantially lower than the capacitance of said node and an output resistance substantially lower than the internal resistance of a source of potential to be connected to said first input.

8. The improvement of claim 7 wherein said buffer means further comprise:

a pair of complementary metal oxide semiconductor transistors connected in the source follower configuration with their channels coupled in series across a source of potential.

* * * * *